United States Patent [19]

Takahashi et al.

[11] Patent Number: 4,962,353
[45] Date of Patent: Oct. 9, 1990

[54] VOLTAGE DETECTOR

[75] Inventors: Hironori Takahashi; Shinichiro Aoshima; Iakuya Nakamura; Yutaka Tsuchiya, all of Shizuoka, Japan

[73] Assignee: Hamamatsu Photonics Kabushiki Kaisha, Shizuoka, Japan

[21] Appl. No.: 256,793

[22] Filed: Oct. 12, 1988

[30] Foreign Application Priority Data

Oct. 13, 1987 [JP] Japan .................. 62-257508

[51] Int. Cl.5 .................. G01R 19/00; G01R 31/02
[52] U.S. Cl. .................. 324/96; 324/158 R; 350/356
[58] Field of Search .................. 324/96, 117 R, 158 R, 324/77 K; 350/356, 374, 376; 356/368

[56] References Cited

U.S. PATENT DOCUMENTS 4,446,425 5/1984 Valmanis et al. .................. 324/77 K

FOREIGN PATENT DOCUMENTS

0160209A1 11/1985 European Pat. Off. .
2202639A 9/1988 United Kingdom .

OTHER PUBLICATIONS

Valdmanis et al., "Electro-Optic . . . ", Laser Focus-/Electro-Optics, Mar. 1986, pp. 96-98, 100, 102, 104, 106.

Tsuchiya et al., "Ultrafast Streak Camera", Proceedings of the 13th International Congress on High Speed Photography and Photonics, Tokyo 1978, pp. 517-520.

"A Performance Demonstration of the Combined Hamamatsu Temporalphotometer", Picosecond, vol. 1, 1978, pp. 1-5.

Schiller et al., "An Ultrafast Streak Camera System: Temporaldisperser and Analyzer", Optical Spectra, Jun. 1980, pp. 1-8.

Primary Examiner—Ernest F. Karlsen
Attorney, Agent, or Firm—Finnegan, Henderson, Farabow, Garrett, and Dunner

[57] ABSTRACT

A voltage detector with an optical modulator comprising a pulse light source for outputting light pulses, a pulse train generator for generating a light pulse train having a pulse interval with the aid of light pulses provided by the pulse light source and for applying the light pulse train to an optical modulator, and a detector for detecting the optical intensities of light pulses forming the light pulse train which are modulated by the optical modulator with a voltage waveform to be detected.

10 Claims, 5 Drawing Sheets

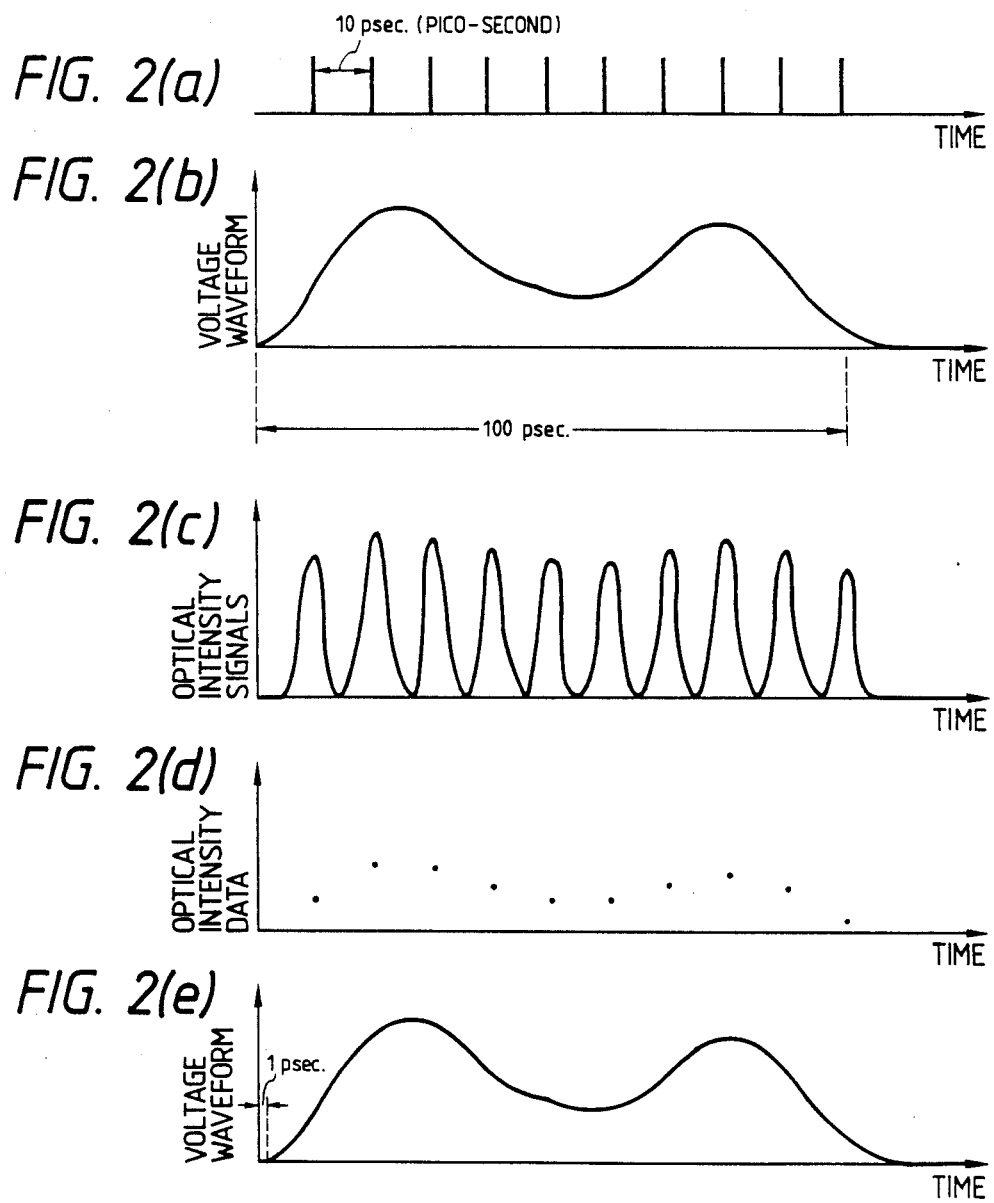

VOLTAGE DETECTOR

BACKGROUND OF THE INVENTION

This invention relates to a voltage detector which employs an optical modulator to detect voltages with a time resolution of the order of picoseconds.

A voltage detector for detecting voltages with an optical modulator is well known in the art. FIG. 5 is a block diagram of a voltage detector of this type disclosed by U.S. Pat. No. 4,446,425.

In the voltage detector of FIG. 5, a pulse light source 50 outputs two beams of short light pulses of the order of 120 femtoseconds ($10^{-15}$ seconds) repeatedly. One of the short light pulses is applied through a chopper 51 and a variable delay unit 52 to an object under measurement 53 such as a photo-electric switch, and the other beam is applied directly to an optical modulator 40. The optical modulator 40 comprises a polarizer 55, a Pockels cell 54, a phase compensator 56, and an analyzer 57. The optical modulator 40 operates on the principle that the incident short light pulse is modulated by the voltage of the object under measurement 53, to obtain a voltage waveform represented by optical intensity. This will be described in more detail. A voltage to be detected which is outputted by the object 53 in synchronization with the short light pulse is applied to the Pockels cell 54 in the optical modulator 40, while a predetermined polarization component of the short light pulse outputted by the pulse light source is extracted by the polarizer 55 and is applied to the Pockels cell 54. The Pockels cell 54 is made up of an electro-optical material such as $LiNbO_3$ or $LiTaO_3$ with a refractive index which is changed by a voltage applied thereto. Due to the nature of the electro-optical material, the short light pulse applied to the Pockels cells is changed in polarization by the voltage of the object under measurement 53; that is, the short light pulse is modulated by the voltage, and output as an emergent light which is applied through the phase compensator 56 to the analyzer 57. The analyzer 57 extracts two orthogonal polarization components from the emergent light provided by the phase compensator, and applies modulated optical intensity signals as the outputs of the optical modulator, to photodetectors 58 and 59, respectively. The photodetectors 58 and 59 detect the optical intensities of the two polarization components, respectively. In a differential amplifier 60, the output signals of the photodetectors 58 and 59 are subjected to differential amplification. The output of the differential amplifier 60 is applied through a lock-in amplifier 61 and an averaging unit 62 to a display unit 63.

The variable delay unit 52 operates to gradually delay the timing of providing the voltage from the object under measurement 53, in order to establish a sampling point. The lock-in amplifier 61 operates to fetch the output of the differential amplifier 60 in synchronization with the chopper 51 to remove noise components. The averaging unit 62 operates to average the output of the lock-in amplifier 61.

In the voltage detector as described above, the photodetectors 58 and 59 have a slow response speed, and therefore, the optical intensity signals of the emergent light from the analyzer 57 have a time width of the order of ten nanoseconds in the photodetectors 58 and 59 as shown in FIG. 7(c). Accordingly, it is essential that the repetitive period of provision of a voltage from the object under measurement 53 is set to higher than ten nanoseconds.

The case where the waveform of a voltage provided by the object under measurement 53 has a time width of 100 picoseconds as shown in FIG. 6 and is detected with a time resolution of one picosecond will now be discussed. In this case, the variable delay unit 52 is initialized at the sampling point $S_1$, and the optical intensity at the sampling point $S_1$ is sampled. The sampling operation is repeatedly carried out with a pulse train having a repetitive period of the order of 10 nsec. (nanoseconds) as indicated by a solid line in FIG. 7(a), and the sampled data is averaged by the averaging unit 62. Then, the variable delay unit 52 is operated to shift the sampling point $S_1$ to the following sampling point $S_2$ which is shifted from the sampling point $S_2$ by 1 psec. (picosecond), and the optical intensity at the sampling point $S_2$ is obtained in the same manner. That is, the variable delay unit 52 is operated one hundred times in the above-described way to obtain one hundred sampling point from $S_1$ through $S_{100}$, and the optical intensities at the sampling points from $S_1$ through $S_{100}$ are repeatedly obtained and averaged, so that the voltage waveform is detected by sampling. At each of the sampling points from $S_1$ through $S_{100}$, the optical intensity signal has a time width of the order of 10 nsec., however, since the sampling timing occurs at intervals of 1 psec., the voltage waveform can be detected with a time resolution of 1 psec.

As described above, in accordance with the conventional voltage detector, a voltage waveform having a time width of 100 psec. is detected with a resolution of 1 psec., and therefore the variable delay unit 52 must be operated one hundred times. That is, the conventional voltage detector has the disadvantage that it is impossible to achieve the detection in a short period of time. If the variable delay unit 52 must be moved for instance 0.3 mm. for a delay of 1 psec., then the variable delay unit 52 must be totally moved 30 mm for sampling when operated one hundred times; that is, the variable delay unit is moved a relatively long distance. This limits the miniaturization and the structural simplification of the variable delay unit 52.

SUMMARY OF THE INVENTION

An object of the present invention is to provide a voltage detector that can achieve the detection of voltage waveforms in a short period of time.

Another object of the present invention is to provide a voltage detector that is small in size and structurally simple.

A further object of the present invention is to eliminate the need for a variable delay unit capable of moving relatively long distances for use in a voltage detector.

The foregoing objects of the invention have been achieved by providing a voltage detector with optical modulating means which, according to the invention, comprises a pulse light source for outputting light pulses, pulse train generating means for generating a light pulse train having a pulse interval from the light pulses provided by the pulse light source and for applying the light pulse train to optical modulating means, and detector means for detecting the optical intensities of light pulses forming the light pulse train which are modulated by the optical modulating means with a voltage waveform to be detected.

BRIEF DESCRIPTION OF THE DRAWINGS

The manner by which the above and other objects are obtained will be fully apparent from the following detailed description when considered with the accompanying drawings, wherein:

FIG. 2(a) is a diagram showing a train of pulses;

FIG. 2(b) is a diagram showing a voltage waveform to be detected;

FIG. 2(c) is a diagram showing optical intensity signals detected by a photodetector in the apparatus;

FIG. 2(d) is a diagram showing optical intensity data outputted by a computer in the apparatus;

FIG. 2(e) is a diagram showing the voltage waveform of FIG. 2(b) which has been shifted by 1 psec. in phase;

DETAILED DESCRIPTION OF THE INVENTION

In the voltage detector of the present invention, the pulse train generating means generates a pulse train in response to light pulses provided by the pulse light source. The pulse train is applied to the optical modulating means, and the voltage waveform is sampled simultaneously at a plurality of sampling points provided in correspondence to the light pulses forming the pulse train. In other words, the light pulses of the pulse train are modulated by the voltage waveform applied to the optical modulating means, and the optical intensities of the light pulses thus modulated are the results of sampling of the voltage waveform at the plurality of sampling points. The optical intensities of the light pulses are applied to the optical detector means, where they are detected simultaneously as the results of sampling. When the voltage waveform or pulse train is shifted in phase by the variable delay means in order to shift the sampling points, the voltage waveform can be sampled at more sampling points. In this case, the amount of time delay by the variable delay means may be on the order of the time interval of the light pulses forming the pulse train, and therefore, the movement of the variable delay means can be decreased to a corresponding amount. Thus, the variable delay unit of the invention can be miniaturized in size and simplified in construction in comparison to that of the conventional voltage detector.

Figure 1:
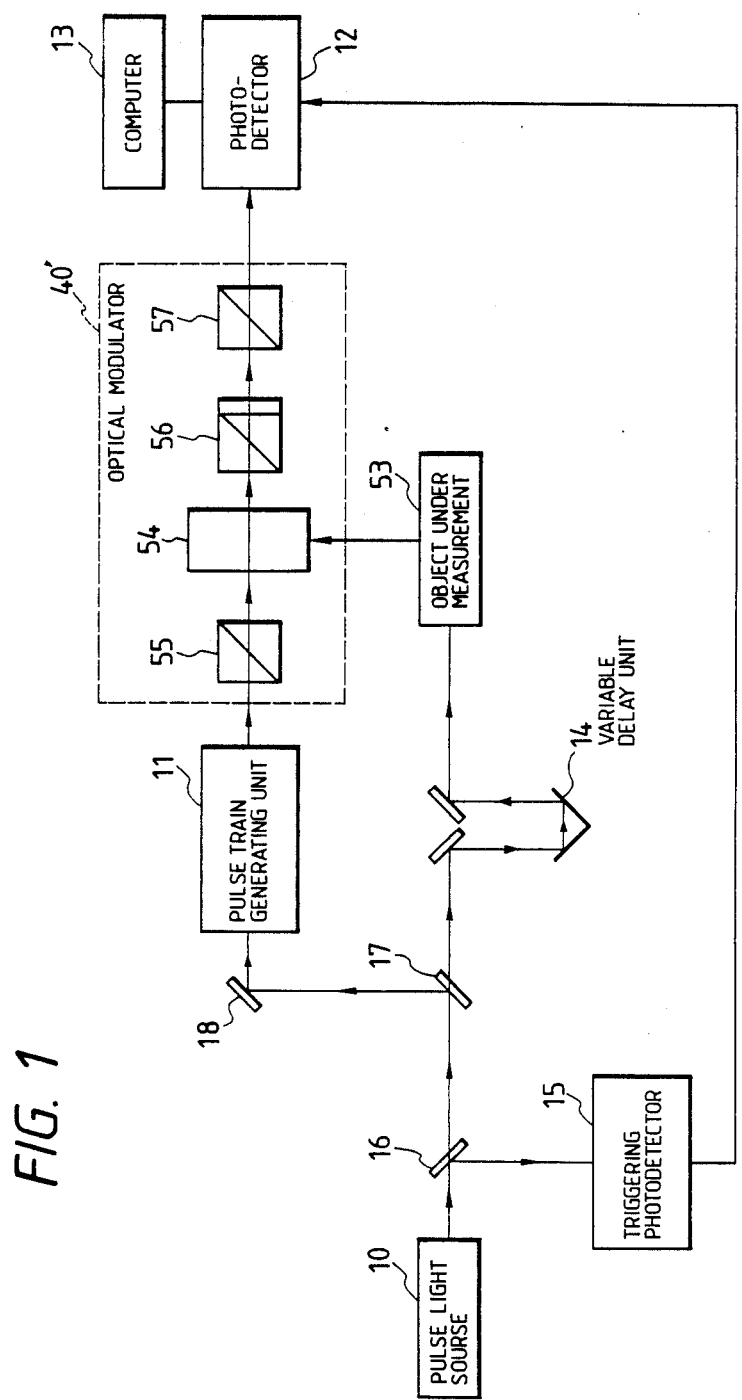
FIG. 1 is an explanatory diagram, illustrated partly as a block diagram, showing the arrangement of one example of a voltage detector according to the present invention.
Figure 5:
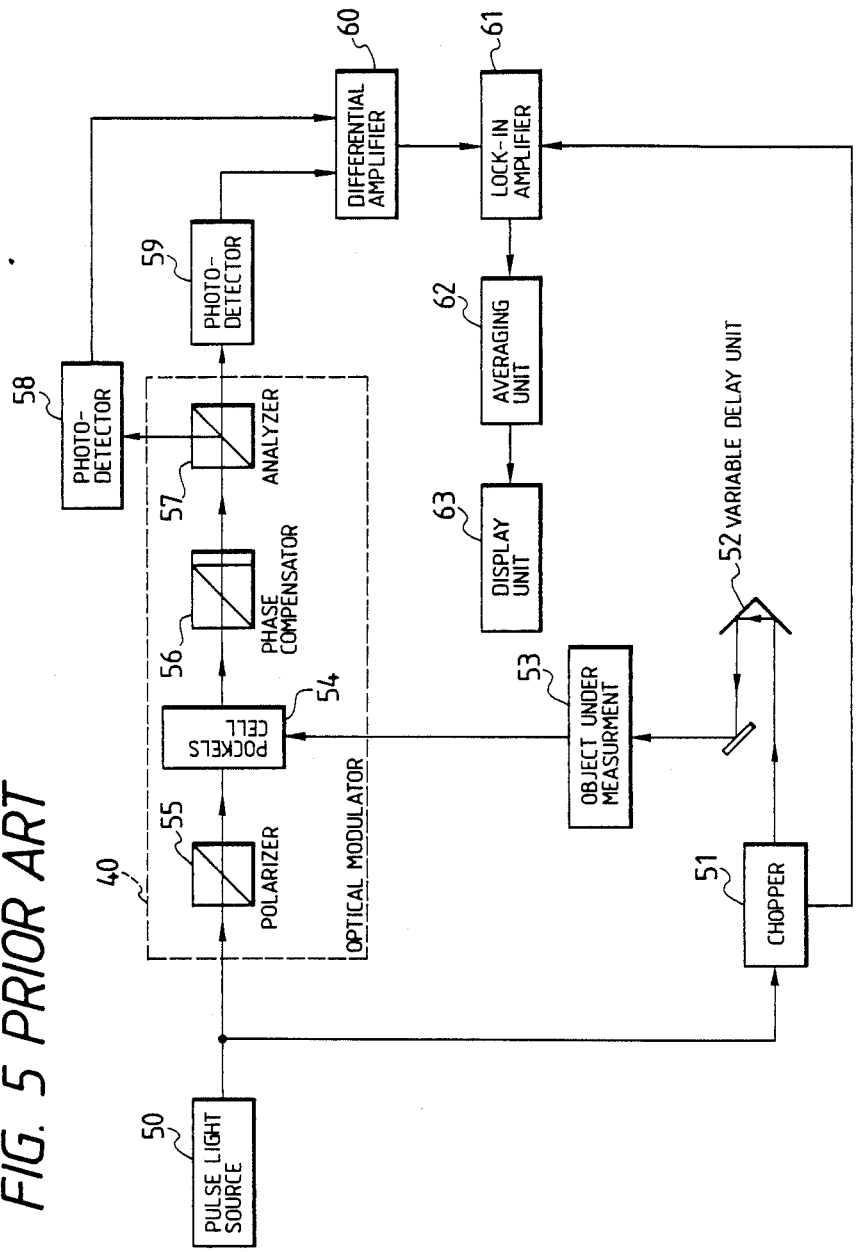
FIG. 5 is an explanatory diagram, illustrated partly as a block diagram, showing a conventional voltage detector.
Figure 6:
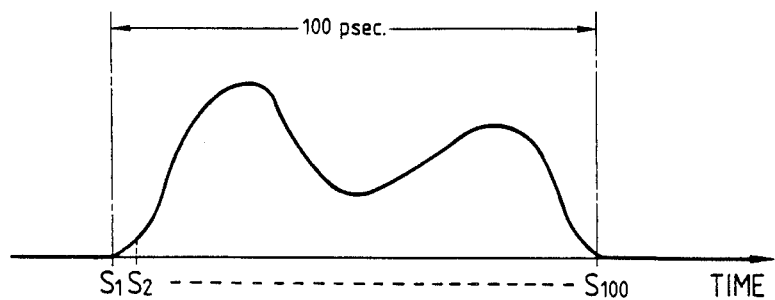
FIG. 6 is a diagram for a description of a voltage waveform sampling operation.
Figure 7A:
FIG. 7(a) is a diagram showing a train of pulses in the conventional voltage detector.
Figure 7B:
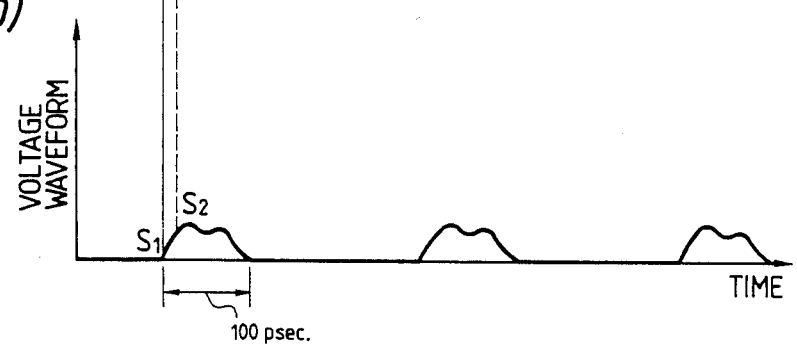
FIG. 7(b) is a diagram showing voltage waveforms to be detected in the conventional voltage detector.
Figure 7C:
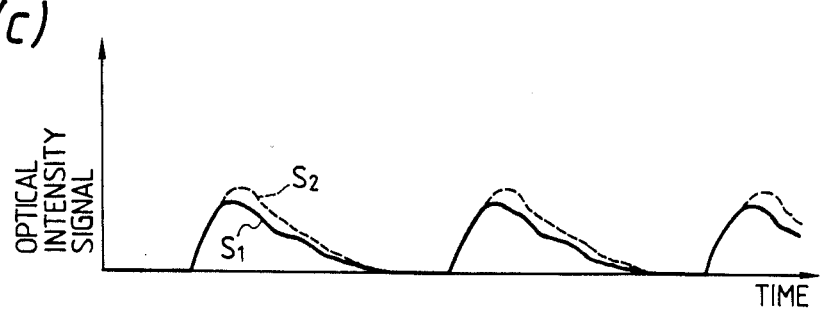
FIG. 7(c) is a diagram showing optical intensity signals from photodetectors used in the conventional voltage detector.

One embodiment of the present invention will be described as an example with reference to the accompanying drawings. FIG. 1 is a block diagram showing the arrangement of one example of a voltage detector according to the invention. In FIG. 1, those components which have been previously described with reference to FIG. 5 are designated by the same reference numerals.

The voltage detector of the embodiment of the invention as shown in FIG. 1 comprises a pulse light source 10 for outputting a light pulse, a pulse train generating unit 11 for generating a train of equally spaced pulses from the output light pulses of the pulse light source 10, and optical modulator 40' for outputting optical intensity signals at a plurality of sampling points sampled with the train of pulses. A photodetector 12 detects the optical intensity signals at the sampling points; and a computer 13 processes the results of detection provided by the photodetector 12.

The plurality of sampling points are gradually shifted as the voltage provided by the object under measurement 53 is delayed by a variable delay unit 14. A trigger signal applied to the photodetector 12 is formed by a triggering photodetector 15. The pulse train generating unit 11 is made up of an optical etalon for instance.

In the voltage detector of the embodiment of the present invention as shown in FIG. 1, a light pulse output by the pulse light source 10 is divided into two parts by a half mirror 16. One of the two parts is applied to half mirror 17, and the other to the triggering photodetector 15. The light pulse applied to the half mirror 17 is applied to the pulse train generating unit 11 after being reflected by a mirror 18, and is also applied to the object under measurement 53 through the variable delay unit 14.

Upon reception of one light pulse, the pulse train generating unit 11 generates a train of light pulses, for instance, a train of ten light pulses as shown in FIG. 2(a), which are applied to the optical modulator 40'. On the other hand, the object under measurement 53 provides a voltage to be detected, as shown in FIG. 2(b). It is assumed in this case that in the train of light pulses of this embodiment, the pulses occur at intervals of 10 psec. and the voltage waveform has a time width of 100 psec.

In the optical modulator 40' of this embodiment, the voltage waveform is sampled as optical intensity signals, at ten sampling points with ten light pulses, for example, and the optical intensity signals are applied to the photodetector 12. In the photodetector 12, the optical intensity signal samples at the ten sampling points of this example are successively detected in synchronization with the trigger signal provided by the triggering photodetector 15 as shown in FIG. 2(c), and are applied to the computer 13.

In order to separately detect the optical intensity signals corresponding to the light pulses of the train, the time resolution of the photodetector 12 must be less than the pulse interval of the train of light pulses. In the case where the pulse interval is 10 psec., the photodetector 12 should be a high speed photodetector such as a sampling type optical-oscilloscope that has a high time resolution of shorter than 10 psec.

When a voltage is repeatedly provided by the object under measurement 53 (with a repetitive period of 10 nsec. for instance), the optical intensity signals sampled at the plurality of sampling points are statistically processed for every sampling point by the computer 13, by adding and averaging for instance, so that the optical intensity data at the ten sampling points in this example corresponding to the time intervals of 10 psec. can be obtained simultaneously as shown in FIG. 2(d). Next, the variable delay unit 14 is adjusted so that the timing of the short light pulse applied to the object 53 from the half mirror 17 is slightly shifted by 1 psec. for instance. As a result, the voltage waveform of the object 53 is as shown by example in FIG. 2(e); that is, the voltage waveform is shifted by 1 psec. in phase from that shown in FIG. 2(b), and the ten sampling points sampled by the train of light pulses shown in FIG. 2(a) are also shifted by 1 psec. In a manner similar to that described above, the optical intensity data at the next ten sampling points of this example can be obtained simultaneously by means of the photodetector 12 and the computer 13.

When the variable delay unit 14 is operated ten times for this example so that the ten sampling points which are 10 psec. apart are shifted by 1 psec. for each time, one voltage waveform can be sampled at one hundred different sampling points to obtain optical intensity data.

In the voltage of the invention, the detection is carried out simultaneously at ten sampling points as was described in the example above. Therefore, the detection time of the voltage detector of this example of the invention can be one-tenth of that of the conventional apparatus shown in FIG. 5. Furthermore, the movement of the variable delay unit 14 in the voltage detector of this example of the invention is also one tenth of the movement of the variable delay unit of the conventional detector. If the variable delay unit is moved 0.3 mm. for a delay of 1 psec., the total movement is only 3 mm.

In the above-described detector of FIG. 1, the time resolution of the apparatus is determined by the pulse width of the light pulses and each movement of the variable delay unit 14 (the time resolution of the photodetector 12 determines only the pulse interval of the train of pulses), and therefore in order to obtain a time resolution of 1 psec. it is necessary to set the pulse width to 1 psec.

Figure 3A:
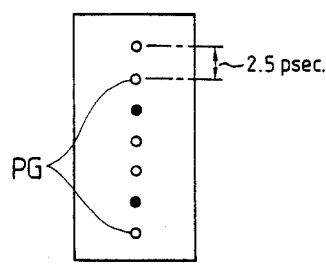
FIG. 3(a) is a diagram showing streak images.
Figure 3B:
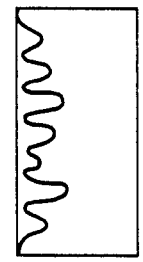
FIG. 3(b) is a diagram showing the result of the analysis of the streak images in FIG. 3(a) which is made with a temporal analyzer.

In the above-described embodiment, a sampling type optical-oscilloscope having a time resolution of the order of 10 psec. is used as the photodetector 12, to sample the voltage waveform simultaneously at the sampling points provided at time intervals of 10 psec. However, in the case where a streak camera having a higher time resolution (2 psec.) is used as the photodetector 12, a laser having pulse width of subpicoseconds may be used as the pulse light source 10, and the interval of the train of pulses may be set to 2.5 psec. for instance. With such a streak camera, as shown in FIG. 3(a), optical intensity signals obtained at a plurality of sampling points provided at intervals of 2.5 psec. can be obtained as streak images PG. The streak images PG are bright points. When the streak images are analyzed with a high performance image analyzer (called "a temporal analyzer") developed for a streak camera, an output waveform as shown in FIG. 3(b) can be obtained. The output waveform is applied to the computer 13 in a manner similar to that shown in FIG. 1, where it is subjected to statistical processing so that the voltage waveform is obtained.

In the case where, as was described above, the interval of the light pulses can be decreased or the longer sampling interval may be required, it is not always necessary to use the variable delay unit 14, and the sampling operations at all the sampling points can be achieved simultaneously in one step with the voltage waveform remaining unshifted.

In the case where the time width of the voltage waveform to be detected is relatively large, for example, several nanoseconds, a photomultiplier tube with a gate may be employed as the photodetector 12.

Figure 4A:
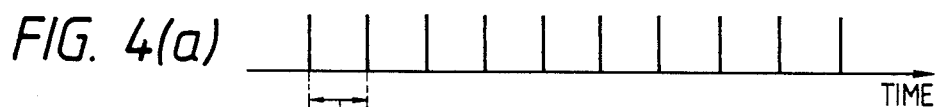
FIG. 4(a) is a diagram showing a train of pulses having a pulse interval of 1 nsec.
Figure 4B:
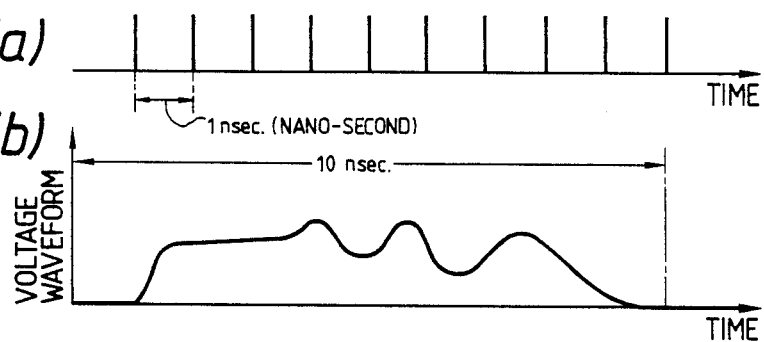
FIG. 4(b) is a diagram showing a voltage waveform having a time width of 10 nsec.
Figure 4C:
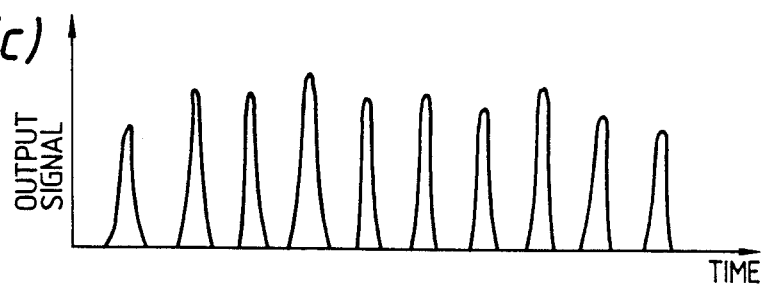
FIG. 4(c) is a diagram showing the output signal of photomultiplier tube with a gate.

When the pulse light source outputs light pulses having a pulse width of 10 psec. and the pulse train generating unit 11 generates pulses at time intervals of 1 nsec. as shown in FIG. 4(a), a voltage waveform having a time width of 10 nsec. as shown in FIG. 4(b) is measured. In this case, the output of the photomultiplier tube is as shown in FIG. 4(c). The output is read with the ordinary oscilloscope or a digital oscilloscope and processed with the computer 13. As was described before, the time resolution of the apparatus is determined from the pulse width of the light pulses and each movement of the variable delay unit 14; i.e., each delay time, and is independent of the time resolution of the photodetector 12. Therefore, if the variable delay unit 14 is displaced 3 mm. each time and the sampling points are shifted 10 psec. each time, then the voltage waveform can be detected with a time resolution of 10 psec. As the pulse interval is 1 nsec., the entire voltage waveform can be detected by displacing the variable delay unit 14 one hundred times, and in this case the total movement of the variable delay unit 14 is 30 cm. In the conventional voltage detector that does not use a pulse train as shown in FIG. 5, the total movement of the variable delay unit is 300 cm. On the other hand, the total movement of the variable delay unit 14 in the voltage detector in accordance with the present invention is much less and the detector can be miniaturized. In addition, the detection time of the present invention is reduced to, for example, one tenth of that of the conventional detector.

In the above-described embodiment, in order to shift the plurality of sampling points, the voltage waveform provided by the object under measurement 53 is shifted in phase by the variable delay unit 14; however, the train of pulses may be shifted in phase by means of a variable delay unit that is connected between the pulse train generating unit 11 and the optical modulator 40'.

The variable delay unit employed in the present invention may be a motor-driven variable delay unit or it may be a glass plate adapted to delay a light pulse stepwise. If such a glass plate, whose refractive index is 1.5, is arranged in the optical path, a glass plate which is 0.6 mm. in thickness can delay the light pulse by 1 psec. The delay time can be controlled freely by changing the thickness of the glass plate or by employing a plurality of such glass plates. A glass plate used for this purpose is covered with a non-reflective coating.

As was described above, in the voltage detector of the invention, the optical intensities of the train of light pulses modulated by the optical modulating means are detected simultaneously, and therefore, the voltage waveform can be sampled simultaneously at a plurality of sampling points. This results in a short detection time, and the operating characteristic of the apparatus is greatly improved over the performance of the conventional detector. When more precise sampling of the voltage waveform is required, the voltage waveform to be detected and/or the train of pulses is gradually shifted in phase by means of the variable delay unit. In the case of shifting, the amount of time delay is still short as a whole, and therefore, the variable delay unit can be small in size and simple in construction in comparison to that of the conventional detector.

What is claimed is:

1. A voltage detector using an electro-optical material with a refractive index that is changed by a voltage provided by a predetermined part of an object under measurement comprising:

an optical modulating means;

a pulse light source for outputting light pulses;

pulse train generating means for generating a light pulse train of n light pulses having a pulse interval from each light pulse provided by said pulse light source and for applying said light pulse train to said optical modulating means within a time duration, where n is an integer greater than one; and detector means for detecting the optical intensities of said n light pulses forming said light pulse train after modulation by said optical modulating means with a voltage waveform to be detected that corresponds in duration to said time duration.

2. A detector according to claim 1, wherein the pulse interval of said train of light pulse is larger than the time resolution of said detector means.

3. A detector according to claim 1, wherein said voltage waveform is shifted in phase.

4. A detector according to claim 1, wherein said train of light pulses is shifted in phase.

5. A detector according to claim 1, further including voltage waveform delaying means for delaying said voltage waveform by a maximum amount of delay time determined from the pulse interval of said train of light pulses.

6. A detector according to claim 1, further including light pulse delaying means for delaying said train of light pulses by a maximum amount of delay time determined from the pulse interval of said train of light pulses.

7. A detector according to claim 1, wherein said detector means is a high-speed photodetector.

8. A detector according to claim 7, wherein said high-speed photodetector is a sampling type optical oscilloscope.

9. A detector according to claim 7, wherein said high-speed photodetector is a streak camera.

10. A detector according to claim 7, wherein said high-speed photodetector is a photomultiplier tube with a gate.

* * * * *